(12) United States Patent
Feil

(10) Patent No.: US 8,331,100 B2
(45) Date of Patent: Dec. 11, 2012

(54) DEVICE HAVING SEVERAL CONTACT AREAS

(75) Inventor: Michael Feil, Munich (DE)

(73) Assignee: Fraunhofer-Gesellschaft zur Foerderung der Angewandten Forschung e.V., Munich (DE)

( * ) Notice: Subject to any disclaimer, the term of this patent is extended or adjusted under 35 U.S.C. 154(b) by 985 days.

(21) Appl. No.: 11/844,513

(22) Filed: Aug. 24, 2007

(65) Prior Publication Data

US 2008/0088006 A1    Apr. 17, 2008

(30) Foreign Application Priority Data

Oct. 13, 2006    (DE) .................... 10 2006 048 583

(51) Int. Cl.
*H05K 7/02* (2006.01)
*H05K 7/06* (2006.01)
*H05K 7/08* (2006.01)
*H05K 7/10* (2006.01)

(52) U.S. Cl. ........ 361/760; 361/761; 361/764; 361/782; 361/300

(58) Field of Classification Search .......... 361/760–764, 361/780–784, 300–318
See application file for complete search history.

(56) References Cited

U.S. PATENT DOCUMENTS

| 4,748,537 | A | * | 5/1988 | Hernandez et al. ........ 361/306.2 |
| 5,126,286 | A | | 6/1992 | Chance |
| 5,590,016 | A | * | 12/1996 | Fujishiro et al. ............ 361/313 |
| 6,307,261 | B1 | * | 10/2001 | Val et al. ....................... 257/698 |
| 6,370,010 | B1 | | 4/2002 | Kuroda et al. |
| 6,545,346 | B2 | * | 4/2003 | Figueroa et al. ............. 257/678 |
| 7,408,249 | B2 | * | 8/2008 | Badihi ......................... 257/678 |
| 7,712,211 | B2 | * | 5/2010 | Chia et al. ...................... 29/841 |
| 7,817,397 | B2 | * | 10/2010 | Anthony ....................... 361/118 |
| 2006/0048889 | A1 | | 3/2006 | Feil et al. |

FOREIGN PATENT DOCUMENTS

| DE | 19840248 A1 | 3/2000 |
| DE | 10105872 A1 | 9/2002 |
| DE | 10321214 A1 | 12/2004 |
| JP | 61-77352 A | 4/1986 |

OTHER PUBLICATIONS

Gengel; "Fluidic Self Assembly As Applied to RFID," Alien Technologies in Low-Cost RFID IC Packaging and Assembly Workshop, organized by Tech Search and Fraunhofer IZM, Nov. 14, 2005.

* cited by examiner

Primary Examiner — Tuan T Dinh
(74) Attorney, Agent, or Firm — Keating & Bennett, LLP

(57) ABSTRACT

A device has a first terminal, second terminal and at least four lateral faces provided with contact areas, of which two respective ones each are mutually opposite. The contact areas of the mutually opposite lateral faces are connected to different ones of the first and second terminals.

10 Claims, 4 Drawing Sheets

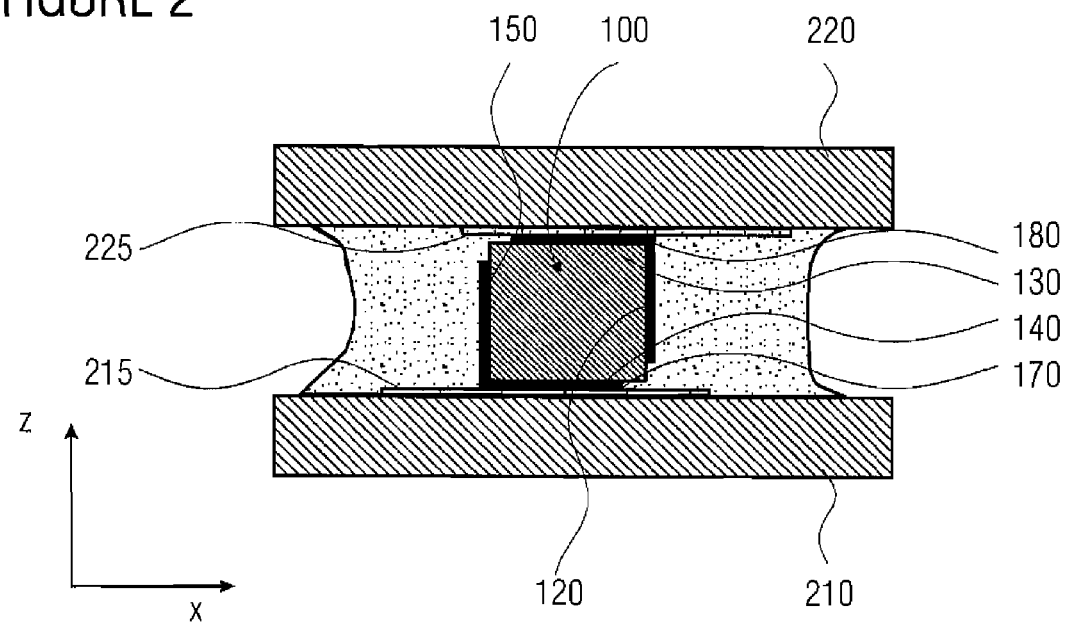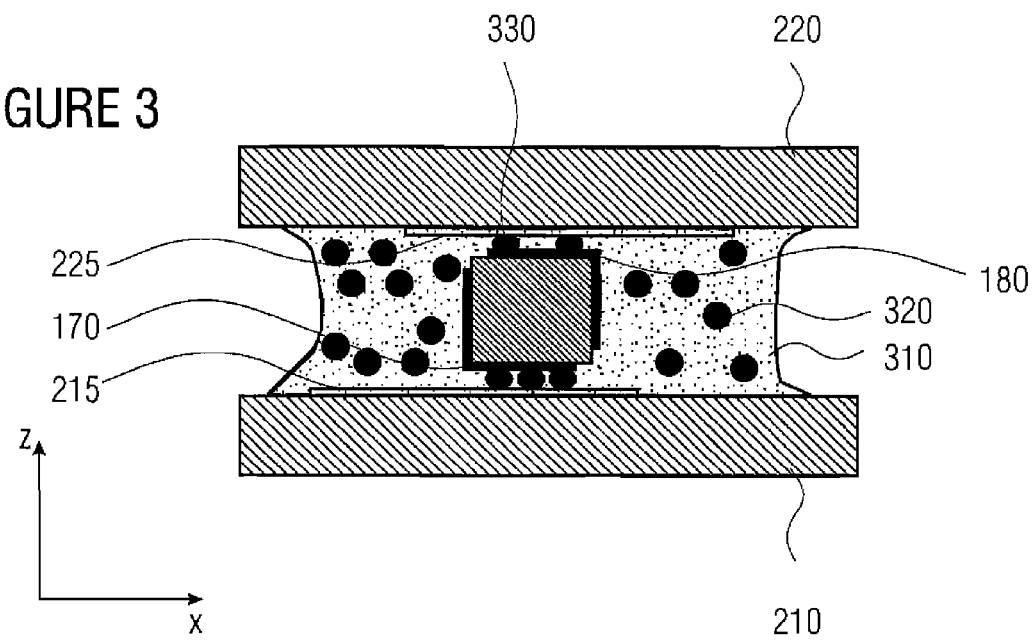

DEVICE HAVING SEVERAL CONTACT AREAS

CROSS-REFERENCE TO RELATED APPLICATIONS

This application claims priority from German Patent Application No. 10 2006 048 583.1, which was filed on Oct. 13, 2006, and is incorporated herein by reference in its entirety.

BACKGROUND OF THE INVENTION

1. Field of the Invention

The present invention relates to a device having several contact areas and to a contacting method and, in particular, to an aligning-free contacting method for devices having two terminals.

2. Description of the Related Art

Electronical devices are employed to an increasing extent in both everyday and special applications. In manufacturing, the electronical devices and/or semiconductor devices which are usually referred to as chips have to be connected to a substrate. Instead of a connection of chip and substrate, chip and chip, chip and wafer or substrate and substrate may also be connected.

Many low current consumption semiconductor devices comprise a two-terminal arrangement. Apart from diodes, typical examples include integrated circuits (ICs) of contactless chip cards or, more specifically, so-called smart labels. This term refers to thin ICs having an approximate shape of a cube, embedded in thin substrates, which is a segment on the market growing particularly fast. However, for labelling everyday products, like, for example, in supermarkets, smart labels should become much cheaper in the future. Expenses may potentially be saved in all fields of label production and the cost of chip mounting may be reduced considerably over the next few years.

Typically, pads or contact areas by means of which an integrated circuit is frequently contacted, are mostly arranged in edge regions on one side (active side) of the chip. For contacting by means of standard methods, this means that either the active side faces an upward direction, i.e. away from the carrier substrate, or a downward direction towards the carrier substrate. In the first case, the device is frequently mounted by means of glue and subsequent wire contacting. In the second case, a so-called flip-chip technique is employed. Here, the chip, with its active side and its contact areas facing down, is soldered or glued to corresponding contact areas of the substrate. In order to ensure secure contact, the contact areas are provided with metallic bumps on one side or both sides.

When mounting by means of glue, the glue is generally cured using pressure. DE 102004014214, however, describes a method using a glue having special conductive particles, such as, for example, silver (Ag), such that pressure only has to applied once for a short time before curing in order to compress the conductive particles.

Recently, developments towards reducing requirements regarding an aligning precision and/or using self-aligning processes can frequently be found in small devices. Methods operating in accordance with the key-hole-principle are applied in the latter case. Examples of this are trapezoid-shaped recesses in an accomodation substrate into which correspondingly shaped chips are washed for example using a liquid. Such a method is, for example, described in the published application DE 10105872 A1 or in "Fluidic Self Assembly as Applied to RFID", Glenn Gengel of Alien Technologies in Low-Cost RFID IC Packaging and Assembly, Workshop, organized by Tech Search and Fraunhofer IZM, Nov. 14, 2005.

The contacting process still necessary is to be seen as a considerable disadvantage of this self-aligning methods.

In order to reduce requirements to aligning precision, an arrangement of the contacts on the lateral faces and/or along one or several edges of a chip is employed. Examples of this are described in DE 10321214 A1, JP 61077352 A or U.S. Pat. No. 5,126,286. In these methods, contacts and/or contact areas of the chip still need to be aligned with respective terminal pads of the substrate.

From the manufacturing point of view, these contacting methods still entail high complexity and, thus, great expenses.

SUMMARY OF THE INVENTION

According to an embodiment, a device may have: a first terminal; a second terminal; and at least four lateral faces provided with contact areas, of which two respective ones each are mutually opposite, wherein the contact areas of the opposite lateral faces are connected to different ones of the first and second terminals.

According to another embodiment, a method for contacting a device having a first and a second terminal and at least four lateral faces provided with contact areas, of which two respective ones each are mutually opposite, the contact areas of the mutually opposite lateral faces being connected to different ones of the first and second terminals, may have the step of: arranging the device, a first terminal pad and a second terminal pad such that the first and second terminal pads contact two of the contact areas arranged on opposite lateral faces.

Embodiments of the present invention are based on the finding that contacting a device having two contacts and/or terminals in an easier and orienting-independent manner is possible when arranging contact areas on the main lateral faces of the device and connecting the contact areas on mutually opposite main lateral faces to different ones of the two terminals of the device.

In one embodiment, the device may, for example, have a cuboid shape, wherein mutually opposite ones of the greater lateral faces of the cuboid are each connected to different terminals. The four main lateral faces may, for example, at least comprise the same size within a tolerance of 20%. The smaller end faces may, but do not have to comprise corresponding contact areas. In such a case, embodiments of the present invention allow easier contacting, since it is insignificant which one of the four main lateral faces points in a predetermined direction.

The device only comprises lateral faces having opposite lateral faces, wherein mutually opposite lateral faces each have contact areas which are connected to respective different ones of the two terminals. Thus, it is completely insignificant which one of the lateral faces points in a predetermined direction so that contacting is possible independent of orientation.

In order to allow basically aligning-free contacting, in embodiments, the terminal pads by means of which the device is contacted are greater than the contact areas so that secure contacting is possible without complicated aligning.

In embodiments, the device basically has a cube shape wherein the lateral faces may have the same size or the size of the lateral faces may differ by not more than 20%.

Embodiments of the present invention thus are based on the fact that, for example in a device having a shape similar to a cube having only two contacts, the terminal pads are designed such that three mutually adjacent faces of the cube form a contact and/or are connected to a contact. The result is that the two contacts will automatically be opposite to each other on opposite faces. An alignment of the contacts on the device and/or element to the contacts on the substrate side is no longer necessary and thus contacting is possible free of aligning. This mounting technique is tolerant towards lateral displacement and rotation of the device. It is also tolerant towards tilting the device by 90° around any axis in parallel to one face.

Installation or insertion in a substrate may take place in different manners. When contacting via a top and bottom face, the device is placed anywhere on the terminal pad of the substrate. Thus, the bottom of the device is in contact with the terminal pad of the substrate and the opposite top side is connected via a second terminal pad. The second terminal pad can be brought to a position above the element by folding the substrate or it is arranged on another substrate connected to the substrate at a different position.

The electrical contact may, for example, be made by soldering or gluing, wherein different methods may be employed when gluing. When contacting by means of non-conducting glue, the contact is made by a direct connection of the contact areas of the device and the substrate. Here, pressure has to be applied for curing. The same also applies to using an anisotropically conductive glue. Anisotropy is produced by means of conductive beads in a non-conductive resin matrix. The beads are slightly deformed under pressure in the contact regions and thus make contact. Here, too, pressure has to be applied for curing. The third way is using a glue having special conductive particles, such as, for example, using a glue slightly filled with Ag. Thus, the special conductive particles are such that pressure is only necessary once for a short time before curing in order to compress the exemplary Ag particles in the contact regions. Using silver is of particular advantage since it is highly conductive and permanent pressure can be dispensed with when curing.

Another set-up example is placing the device in an interruption of a conductive track. This may take place by injecting the device into the conductive track or by piercing or cutting the conductive track for an interruption and subsequently introducing the device. The contact here is made via the bent conductive tracks to the lateral walls of the device. It may be provided with a drop of glue and/or a film laminated thereon for fixing purposes or the film substrate may be shrunk slightly.

Thus, embodiments of the present invention describe a device and a method which is particularly suitable for contacting two-terminal unhoused devices having the approximate shape of a cube, such as, for example, ICs. The contacting regions on the device are implemented such that opposite faces are associated to different terminals. Thus, it is insignificant on which side the device is finally arranged when being placed. There will be clear contacting to the two terminals of the substrate by top/bottom or left/right or front/back. Thus, the device needs only be finally arranged with one lateral face some place on the contact metallization.

Thus, the method is automatable very easily. For this reason, it is of special interest where a very cheap production is important. Contacting ICs in contactless chip cards or a subquantity "smart label" thereof is to be mentioned here as a typical application. The possible applications, however, are not limited to unhoused devices. The method may also be applied to all two-terminal devices having a shape similar to a cube.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

Embodiments of the present invention will be detailed subsequently referring to the appended drawings, in which:

FIG. 2 shows a contacting of the cube-shaped device through two terminal pads of a substrate using a non-conducting glue.

FIG. 3 shows a contacting of the cube-shaped device like in FIG. 2 using an anisotropically conducting glue.

DETAILED DESCRIPTION OF PREFERRED EMBODIMENTS

Figure 1A:
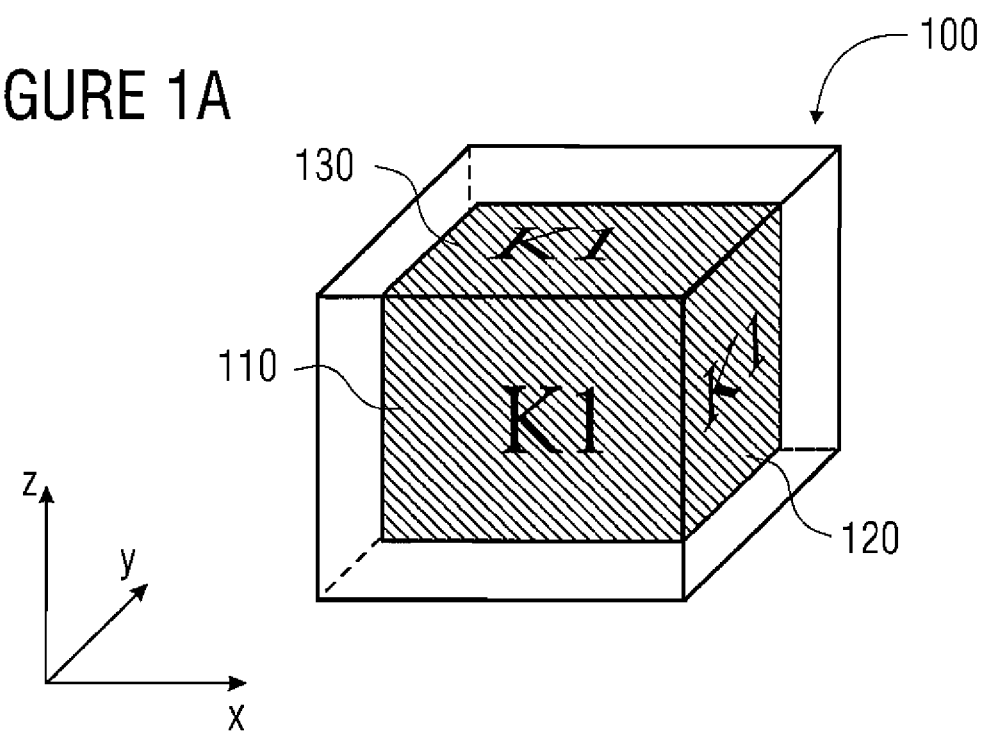
FIGS. 1a,b,c show a spatial view of a device having a cube and cuboid shape, respectively, according to an embodiment of the present invention.

Before the present invention will be discussed in greater detail below referring to the drawings, it is to be pointed out that same elements in the Figures are provided with same or similar reference numerals and that a repeated description of these elements is omitted.

FIG. 1 shows a spatial view of a cube-shaped and cuboid-shaped device 100, respectively, according to an embodiment of the present invention.

Figure 1B:
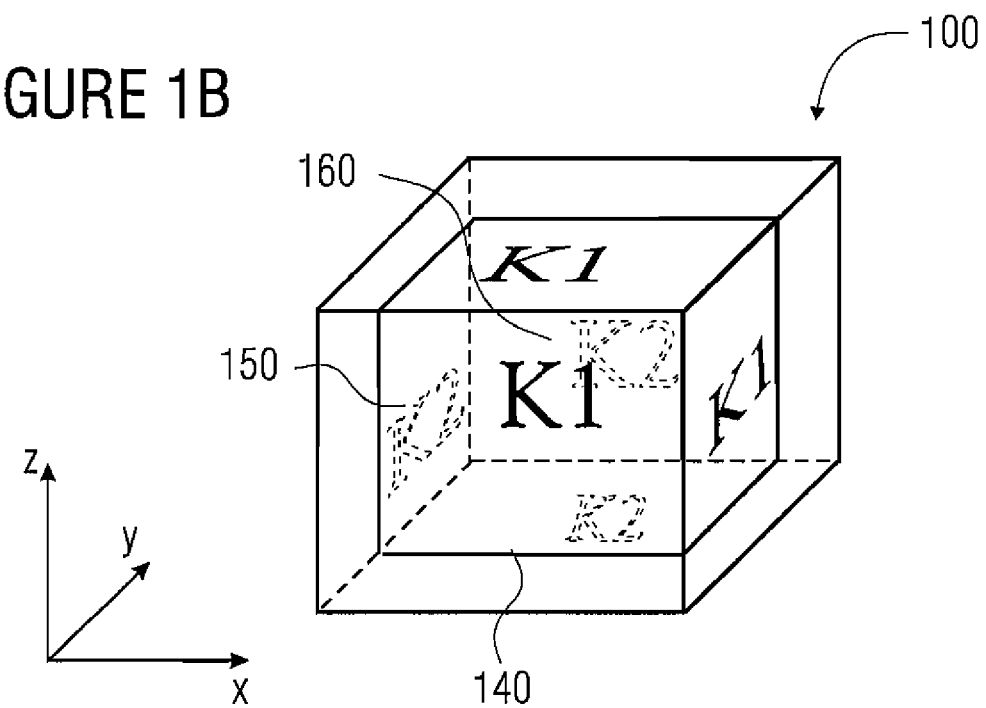
Figure 1C:
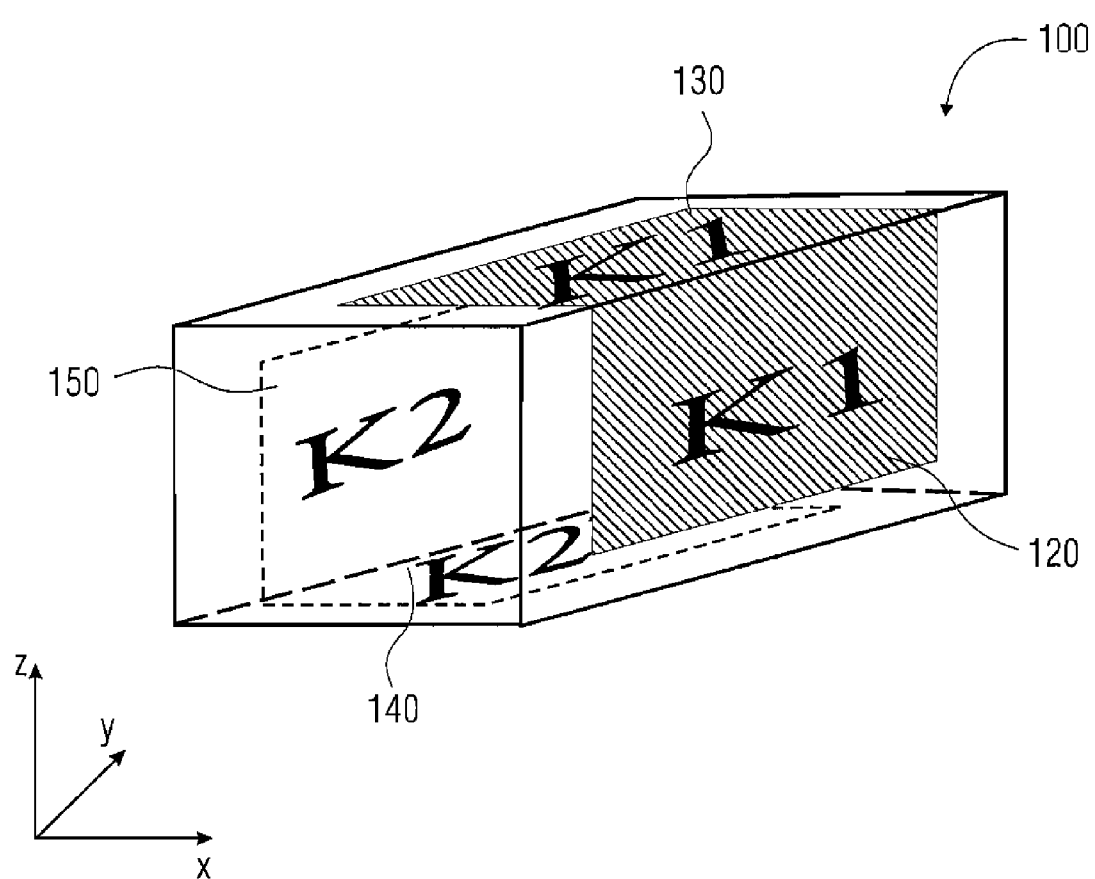

In FIG. 1a, three front lateral faces 110, 120 and 130 are shown, wherein the lateral face 110 is arranged in parallel to the x,z plane, the lateral face 120 is arranged in parallel to the y,z plane and the lateral face 130 is arranged in parallel to the x,y plane. According to the invention, these three neighbouring lateral faces are connected to the first terminal K1 (not shown in this Figure). FIG. 1b also shows the back lateral faces 140, 150 and 160 which are hidden in FIG. 1a by the front lateral faces 110, 120 and 130. The back lateral face 140 is opposite the lateral face 130, the back lateral face 150 is opposite the lateral face 120 and the back lateral face 160 is opposite the lateral face 110. According to the invention, the back lateral faces 140, 150 and 160 are connected to the second terminal K2 of the device 100. In contrast to the embodiment shown in FIG. 1a and FIG. 1b, in the embodiment shown in FIG. 1c, the lateral faces in parallel to the x,z plane are considerably smaller than the other lateral faces. In this cuboid-shaped device 100, only the main lateral faces 120 and 130 are contacted to the terminal K1 and the main lateral faces 140 and 150 are contacted to the terminal K2. According to the invention, here, too, opposite lateral faces are connected to different ones of the two terminals K1, K2.

FIG. 1 only shows a schematic illustration which is to illustrate the contacting of the individual side faces. In a specific embodiment, the individual lateral faces comprise contact areas (not shown in FIG. 1) which are connected to both terminals K1, K2 of the device 100. These contact areas generally do not cover the entire side face, but only extend over a subregion of the respective side faces. It can be seen from the illustration of FIG. 1 how the terminals K1 and K2 can be contacted. With a possible contacting from the top (positive z direction) and below (negative z direction), both contacts K1 and K2 of the device 100 are contacted automatically. The same applies when contacting takes place from the front (negative y direction) and the back (positive y direction) and/or from the right hand side (positive x direction) and the left hand side (negative x direction).

FIG. 2 shows a contacting of the device 100 through a first substrate 210 having a first terminal pad 215 and second substrate 220 having a second terminal pad 225. This cross sectional view shows the x,z plane and the device 100 here is placed with opposite side faces 130, 140 between the first and second terminal pads 225, 215 such that the contact area 180 applied on the side face 130 contacts the terminal pad 225. In analogy, the contact area 170 applied on the lateral face 140 contacts the terminal pad 215. The gap between the first and second substrate parts 210, 220 is filled by a glue 240 which in this embodiment is not conducting so that the first and second terminal pads 215 and 225 are in direct contact to the contact areas 170 and 180 of the device 100.

The first and second contact areas 170, 180 in this embodiment are illustrated as a layer which is not shown in FIG. 1 and connected to the first and second terminals K1 and K2. When contacting, the device 100 is placed with any lateral face (in FIG. 2 the lateral face 140) on the first substrate part 210 with the first terminal pad 215 and subsequently the second substrate part 220 with the second part 225 is placed on the device 100 (i.e. on the opposite lateral face 130 of the device 100). The non-conducting glue 240 applied is finally cured applying pressure. Thus, the specific position and/or orientation of the device 100 at and/or on the terminal pads 215, 225 is insignificant for the contacting of the terminals K1 and K2. In any case, both terminals K1 and K2 are contacted without further aligning being necessary.

FIG. 3 shows a contacting of a cube-shaped device 100 which only differs from the contacting described in FIG. 2 in that a glue 310 containing conductive beads and/or particles 320 is used here. The cube-shaped device 100 with the contact areas 170, 180 is again placed between a substrate part 210 with a first terminal pad 215 and a second substrate part 220 with a second terminal pad 225 so that the first terminal pad 215 and the second terminal pad 225 are arranged on opposite lateral faces of the cube-shaped device 100.

In this embodiment, however, there is generally no direct contact between the first terminal pad and the first contact area 170 and the second terminal pad 225 and the second contact area 180. Rather, the connective beads 320 making electrical contact between the first terminal pad 215 and the contact area 170 and/or between the second terminal pad 225 and the contact area 180 are placed therebetween. In this embodiment, too, the glue 310 is cured by applying pressure wherein the beads 330 which are arranged between the first terminal pad 215 and the contact area 170 and/or between the second terminal pad 225 and the contact area 180 are deformed.

The lateral faces of the device 100 are basically parallel, wherein the usage of conductive beads 320 is of advantage in that potential inhomogeneities and/or deviations from being parallel can be compensated. In the specific design, it is to be kept in mind that the density of the conductive particles and/or beads 320 in the glue 320 must not cause a short between the first terminal pad 215 and the second terminal pad 225, i.e. the density of the conductive particles 320 in the glue must be correspondingly low.

Figure 4:
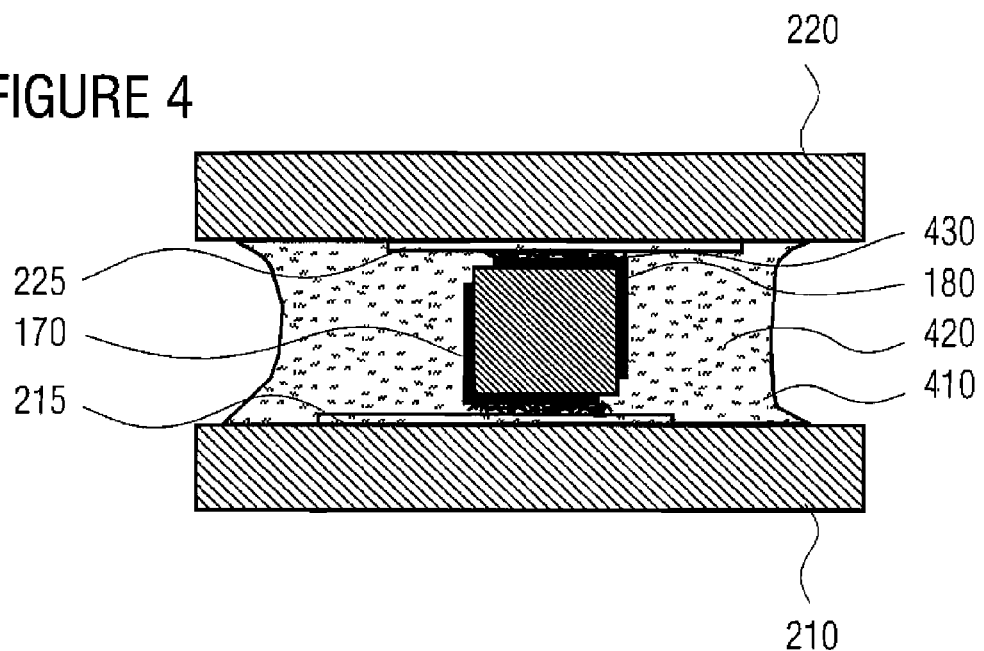
FIG. 4 shows a contacting of the cube-shaped device like in FIG. 2 using a glue slightly filled with silver.

FIG. 4 shows an embodiment which differs from the embodiment described in FIG. 3 in that a glue 410 which is filled by special conductive particles 420 (possibly including little silver) is used. The cube-shaped device 100 with the contact areas 170, 180 is again placed between a substrate part 210 with a first terminal pad 215 and a second substrate part 220 with a second terminal pad 225 so that the first terminal pad 215 and the second 225 are arranged on opposite lateral faces of the cube-shaped device 100.

The special conductive particles 420 (i.e. exemplarily the silver portion) have the result that in this embodiment the glue 410 need not be cured by applying pressure but that pressure only has to be applied once before curing, the pressure causing a compression of the particles 420 between the first terminal pad 215 and the contact area 170 and the second terminal pad 225 and the contact area 180. The clogging 430 of the particles 420 in the gap between the terminal pads 215, 225 and the contact areas 170, 180 caused thereby makes sufficient electrical contact, also without further pressure being applied.

Figure 5:
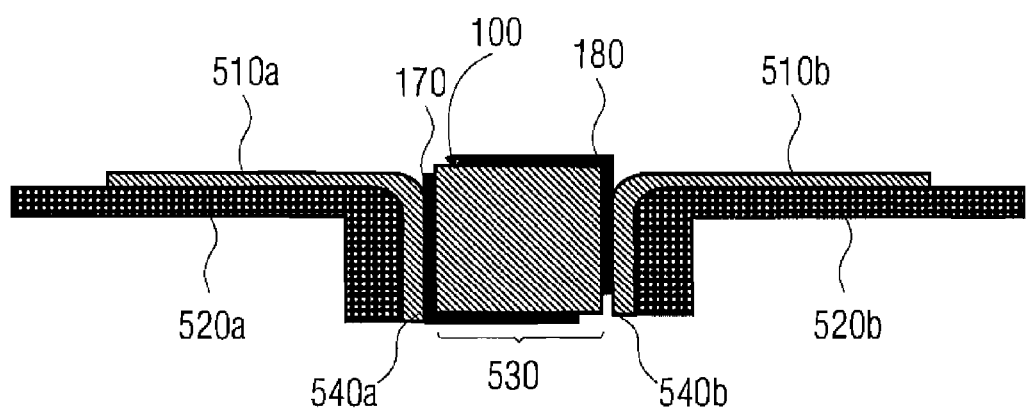
FIG. 5 shows a usage of a cube-shaped device as a connecting element between an interrupted conductive track of a substrate.

FIG. 5 shows a cross sectional view of another embodiment of the present invention in which the cube-shaped device 100 is contacted by an interrupted conductive track 510 applied on a substrate 520. What is shown is a left part of the substrate 520a with a left part of the conductive track 510a which is separated from a right part of the substrate 520b with a right part of the conductive track 510b by an interruption and/or recess 530. The left part of the conductive track 510a and the right part of the conductive track 510b thus also extend along an edge region 540a and 540b of the recess 530. In order to contact the cube-shaped device 100, the device 100 is placed in the recess 530 so that the left interrupted conductive track 510a and the right interrupted conductive track 510b contact terminals on opposite faces (in this example faces 120 and 150) of the cube-shaped device 100. Thus, a connection is made between the first part of the interrupted conductive track 510a and the contact area 170 and between the right part of the conductive track 510b and the contact area 180.

In this embodiment, the recess 530 can either be produced before inserting the cube-shaped device 100, exemplarily by piercing or cutting the conductive track 510, or the interruption 530 can also be produced by pressing device 100 into the substrate 520 by applying pressure so that the conductive track 510 is interrupted and at the same time contact is made between the contact areas 170, 180 and the right and left parts of the conductive track 510b, 510a.

In order to sufficiently support the device 100, the recess 530 can be filled by a glue optionally containing conductive particles before inserting the device 100 and/or glue can be applied after inserting the device 100. Furthermore, mechanical support can also be produced by depositing a film and/or an additional layer on the conductive track 510 and the device 100.

In further embodiments, stable contact between the contact area 170 and the first terminal pad 215 and/or between the contact area 180 and the second terminal pad 225 may also be made by a solder connection.

When there is sufficient pressure so that the device 100 is fixed between the first substrate part 210 and the second substrate part 220, using a glue and/or a solder connection can be dispensed with. The first substrate part 210 and the second substrate parts 220 may be part of a common substrate which is folded and thus layered and/or the first substrate part 210 and the second substrate part 220 may be parts of different substrates.

In summary, the present invention describes a device and a method which is particularly suitable for contacting two-terminal devices 100 having approximately the shape of cubes. Contact areas 170, 180 on the device 100 are, as has been explained, designed such that opposite faces will be associated to different contact regions. The form and shape of the contact areas 170, 180 here may vary. Apart from a layered design, it is also possible to form the contact areas 170, 180 as individual or several contact points.

Another important advantage of the present invention is that it is insignificant on which face the device 100 is finally arranged when contacting. Thus, the method may be automated very easily. Consequently, it is of particular interest where a very cheap production is important.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A device comprising:
   a two-terminal electronic device comprising a first terminal and a second terminal and no other terminals; and
   at least four lateral faces each provided with only one electrical contact area, at least two of the least four lateral faces are mutually opposite to each other; wherein
   the contact areas of the two mutually opposite lateral faces are connected to different ones of the first and second terminals; wherein
   the device is mounted to a substrate having an interrupted conductive track, a first part of the conductive track contacts the contact area provided on a first one of the lateral faces, and a second part of the conductive track, which is separated from the first part of the conductive track, contacts the contact area provided on a second one of the lateral faces opposite to the first one of the lateral faces.

2. The device according to claim 1, wherein the device is a polyhedron comprising at least two pairs of mutually opposite lateral faces, wherein the edge lengths of the lateral faces of the pairs of mutually opposite lateral faces correspond to each another within a tolerance range of 20%.

3. The device according to claim 1, wherein the contact areas are formed by layers applied on the lateral faces.

4. The device according to claim 1, wherein the contact areas each cover a portion of more than 50%, 60%, 70%, 80% or 90% of the associated lateral faces.

5. The device according to claim 2, wherein the device is cube-shaped.

6. A device comprising:
   a first terminal;
   a second terminal; and
   at least four lateral faces each provided with only one electrical contact area, at least two of the at least four lateral faces are mutually opposite to each other; wherein
   the contact areas of the two mutually opposite lateral faces are connected to different ones of the first and second terminals; and
   the contact areas of two of the at least four lateral faces that are adjacent to each other are connected to the same one of the first and second terminals; wherein
   the device is mounted to a substrate having an interrupted conductive track, a first part of the conductive track contacts the contact area provided on a first one of the lateral faces, and a second part of the conductive track, which is separated from the first part of the conductive track, contacts the contact area provided on a second one of the lateral faces opposite to the first one of the lateral faces.

7. The device according to claim 6, wherein the device is a polyhedron comprising at least two pairs of mutually opposite lateral faces, wherein the edge lengths of the lateral faces of the pairs of mutually opposite lateral faces correspond to each another within a tolerance range of 20%.

8. The device according to claim 6, wherein the contact areas are formed by layers applied on the lateral faces.

9. The device according to claim 6, wherein the contact areas each cover a portion of more than 50%, 60%, 70%, 80% or 90% of the associated lateral faces.

10. The device according to claim 7, wherein the device is cube-shaped.

* * * * *

UNITED STATES PATENT AND TRADEMARK OFFICE
CERTIFICATE OF CORRECTION

| | | |
|---|---|---|
| PATENT NO. | : 8,331,100 B2 | Page 1 of 1 |
| APPLICATION NO. | : 11/844513 | |
| DATED | : December 11, 2012 | |
| INVENTOR(S) | : Michael Feil | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1088 days.

Signed and Sealed this
Eleventh Day of November, 2014

Michelle K. Lee
*Deputy Director of the United States Patent and Trademark Office*